(12) United States Patent
Liu et al.

(10) Patent No.: US 8,294,248 B2
(45) Date of Patent: Oct. 23, 2012

(54) CHIP ON LEADS

(75) Inventors: Chenglin Liu, San Jose, CA (US);
Shiann-Ming Liou, Campbell, CA (US)

(73) Assignee: Marvell World Trade Ltd., St. Michael (BB)

( * ) Notice: Subject to any disclaimer, the term of this patent is extended or adjusted under 35 U.S.C. 154(b) by 852 days.

(21) Appl. No.: 11/943,793

(22) Filed: Nov. 21, 2007

(65) Prior Publication Data

US 2008/0128876 A1 Jun. 5, 2008

Related U.S. Application Data

(60) Provisional application No. 60/867,969, filed on Nov. 30, 2006.

(51) Int. Cl.
*H01L 23/495* (2006.01)

(52) U.S. Cl. .............. 257/676; 257/E23.039; 438/111; 438/123

(58) Field of Classification Search ........... 257/E23.039; 438/111
See application file for complete search history.

(56) References Cited

U.S. PATENT DOCUMENTS

| | | | |
|---|---|---|---|
| 5,373,188 A | 12/1994 | Michii et al. | |
| 5,428,247 A * | 6/1995 | Sohn et al. | 257/676 |
| 5,434,449 A * | 7/1995 | Himeno et al. | 257/690 |
| 6,261,865 B1 * | 7/2001 | Akram | 438/111 |
| 6,265,763 B1 * | 7/2001 | Jao et al. | 257/676 |
| 6,368,899 B1 * | 4/2002 | Featherby et al. | 438/127 |
| 6,495,908 B2 * | 12/2002 | Yang et al. | 257/676 |
| 7,005,325 B2 * | 2/2006 | Chow et al. | 438/123 |
| 2002/0149103 A1 | 10/2002 | Yang et al. | |

FOREIGN PATENT DOCUMENTS

| | | |
|---|---|---|
| DE | 43 01 915 A1 | 5/1994 |
| JP | 04 364066 A | 12/1992 |
| JP | 08 162599 A | 6/1996 |
| TW | 488045 | 5/2002 |

* cited by examiner

*Primary Examiner* — Michelle Mandala
*Assistant Examiner* — Shaka White

(57) ABSTRACT

Described herein are microelectronic packages including a plurality of bonding fingers and multiple integrated circuit chips, at least one integrated circuit chip being mounted onto the bonding fingers. According to various embodiments of the present invention, mounting the integrated circuit chip onto the bonding fingers may reduce the pin-out count by allowing multiple integrated circuit chips to be interconnected within the same microelectronic package. Other embodiments may be described and claimed.

13 Claims, 7 Drawing Sheets

CHIP ON LEADS

CROSS REFERENCE TO RELATED APPLICATIONS

The present application is a non-provisional application of, and claims priority to, provisional application 60/867,969, entitled "CHIP ON LEADS," filed on Nov. 30, 2006. The entire disclosure of said provisional application is hereby incorporated by reference in its entirety.

TECHNICAL FIELD

Embodiments of the present invention relate to the field of integrated circuits, and more particularly, to microelectronic packages.

BACKGROUND

In the current state of integrated circuit technology, an integrated circuit device will often be in the form of a chip. Such a chip sometimes will be mounted onto a leadframe to form a package. Interconnecting the chip with a leadframe, and components external to the package, may sometimes involve interconnecting bond pads of the chip with bonding fingers around the periphery of the leadframe, which may then form the pin-out. The pins may be in the form of, for example, external leads or bond pads, and may electrically interconnect the package with external components such as, for example, another package.

The pin-out of a package may depend on the signaling, power, and ground requirements for the die inside the package. In interconnecting the package to another package, certain pins may be required, and the other package may also require certain pins for the interconnection. Thus, this type of interconnection affects the ultimate pin-out count for each package.

In addition to an increased pin-out count, multiple packages on a system level board may consume an undesirable amount of so-called "real estate." Resultantly, the size of a device incorporating the board having the packages mounted thereon may be affected. Certain functionalities may need to be sacrificed in order to balance against the size demands.

Efforts have been made to remedy these problems. For example, multiple-chip leadframes have been designed, the leadframes including multiple die paddles for mounting the dies thereon. Unfortunately, manufacturing these leadframes may add cost in terms of time and money due to the leadframes having to be specially designed. As a result, sometimes multichip packages are forgone altogether, and standard single-chip packages are used instead. This solution, however, fails to reduce the spacing impact (and associated cost) on the system level board, nor does this solution reduce the complexity of packaging operations.

SUMMARY OF THE INVENTION

In view of the challenges in the state of the art, embodiments of the present invention are directed to microelectronic packages including a plurality of bonding fingers and multiple integrated circuit chips, at least one integrated circuit chip being mounted onto the bonding fingers. According to various embodiments of the present invention, mounting the integrated circuit chip onto the bonding fingers may reduce the pin-out count by allowing multiple integrated circuit chips to be interconnected within the same microelectronic package.

According to various embodiments of the present invention, a microelectronic package may comprise a leadframe including a plurality of bonding fingers, the plurality of bonding fingers forming a surface, and further comprising a first integrated circuit chip mounted onto at least a first portion of the surface formed by the bonding fingers. In various embodiments, the first integrated circuit chip may be mounted onto the surface using an adhesive. In some of the embodiments, the adhesive is a die-attach film.

In various embodiments, at least a portion of a first bonding finger may be fused to at least a portion of a second bonding finger, and in some embodiments, the first and the second bonding fingers may have the first integrated circuit chip mounted thereon.

According to various embodiments, the microelectronic package may further comprise a second integrated circuit chip mounted onto the leadframe. In some of the embodiments, the second integrated circuit chip may be mounted onto a second portion of the surface formed by the bonding fingers. In other embodiments, the second integrated circuit chip may be mounted onto a die paddle. In still further embodiments, the second integrated circuit chip may be mounted onto the first integrated circuit chip. According to various embodiments, the first and the second integrated circuit chips may be electrically interconnected.

In some embodiments, one or more portions of the leadframe may be down-set. In some embodiments, at least a portion of the bonding fingers having the first integrated circuit chip mounted thereon may be down-set relative to other portions of the bonding fingers. In some embodiments having a leadframe including a die paddle, the die paddle may be down-set and the second integrated circuit chip may be mounted thereon.

Any one or more features of various embodiments of the present invention may be incorporated into any leadframe-based package. Such leadframe-based packages may include, but are not limited to, quad flat packages, leadless quad flat packages, thin quad flat packages, quad flat no-lead packages, and thin small outline packages.

According to various embodiments, the microelectronic package may be included in type of device known in the art. For example, in various embodiments, the microelectronic package may be included in an apparatus selected from a group comprising a mobile phone, a laptop computer, a personal digital assistant, a gaming device, a music player, and a video player.

Other features that are considered as characteristic for various embodiments of the present invention are set forth in the appended claims.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

The description may use the phrases "in an embodiment," "in embodiments," or "in various embodiments," which may each refer to one or more of the same or different embodiments. Furthermore, the terms "comprising," "including," "having," and the like, as used with respect to embodiments of the present invention, are synonymous.

The phrase "A/B" means A or B. For the purposes of the present invention, the phrase "A and/or B" means "(A), (B), or (A and B)." For the purposes of the present invention, the phrase "at least one of A, B, and C" means "(A), (B), (C), (A and B), (A and C), (B and C), or (A, B and C)." For the purposes of the present invention, the phrase "(A)B" means "(B) or (AB)," that is, A is an optional element.

The terms chip, integrated circuit, monolithic device, semiconductor device, and microelectronic device are often used interchangeably in the microelectronics field. The present invention is applicable to all of the above as they are generally understood in the field.

Figure 1:
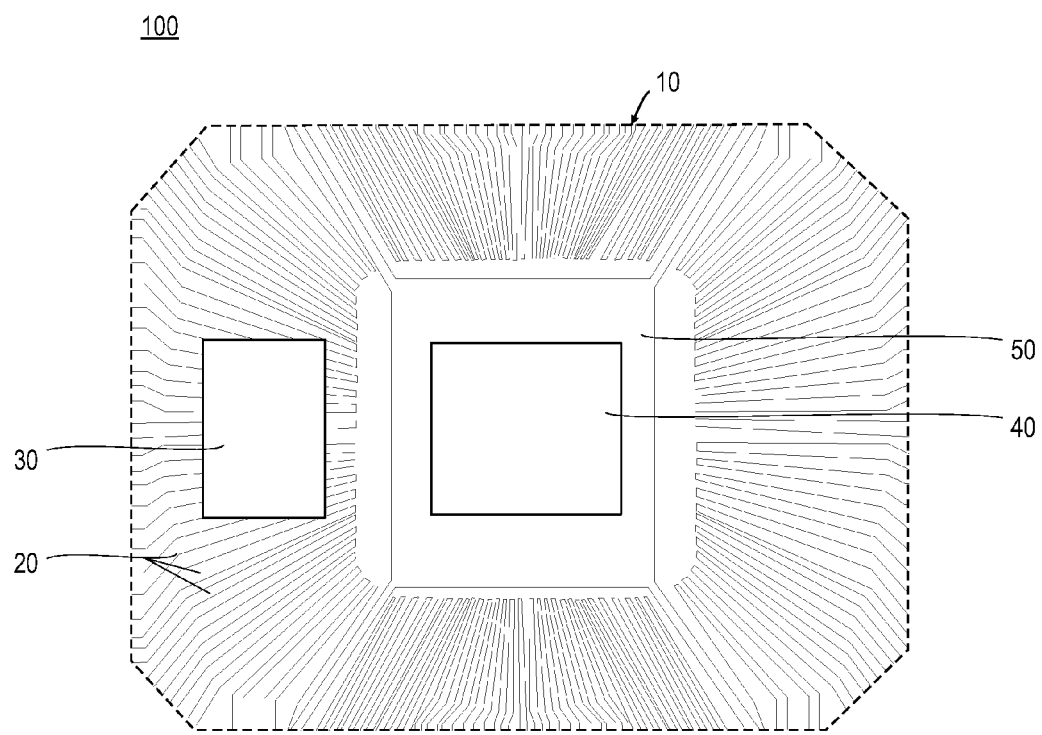
FIG. 1 is a cutaway top view of a microelectronic package, in accordance with various embodiments of the present invention.

Embodiments of a novel microelectronic package are disclosed herein. According to various embodiments and as illustrated in FIG. 1, a microelectronic package 100 may comprise a leadframe 10 including a plurality of bonding fingers 20 (sometimes referred to in the art as "lead fingers") and a first integrated circuit chip 30 mounted on a portion of the surface formed by the bonding fingers 20. The microelectronic package 100 may also include a second integrated circuit chip 40 mounted on a die paddle 50.

Bonding fingers 20 may form the pin-out of microelectronic package 100, either directly or via, for example, external leads or bond pads (not shown). The pins may be configured to interconnect microelectronic package 100 to one or more of signals, ground, and power, as in conventional packages. However, since both first and second integrated circuit chips 30, 40 are included in microelectronic package 100, dedicated pins are not required for interconnecting first and second integrated circuit chips 30, 40. Rather, first and second integrated circuit chips 30, 40 may be interconnected directly, by wires, for example, within microelectronic package 100. Interconnections between first and second integrated circuit chips 30, 40 are omitted in FIG. 1 for the sake of clarity, but are illustrated in more detail in FIGS. 3-7.

Although the embodiment illustrated in FIG. 1 depicts two integrated circuit chips 30, 40, other configurations are possible. For example, one or more additional integrated circuit chips could be located on another portion of the surface formed by the bonding fingers 20. In other embodiments, leadframe 10 may include bonding fingers 20 only, without die paddle 50, and a single integrated circuit chip may be mounted anywhere thereon. In still further embodiments, one or more integrated circuit chips may be stacked over another one or more integrated circuit chips.

In various embodiments, bonding fingers 20 may become increasingly narrower in width towards the center of leadframe 10, as can generally be seen in FIG. 1. Accordingly, there is risk of individual bonding fingers 20 moving during any one or more of various packaging operations including, for example, during mounting of an integrated circuit chip, wire-bonding, or encapsulation. Such movement may increase the likelihood of individual bonding fingers 20 touching other individual bonding fingers 20, which may result in a short if such contact is not intended. Accordingly, it may be desirable to secure bonding fingers 20, either temporarily or permanently, to avoid or minimize such contact.

Figure 2:
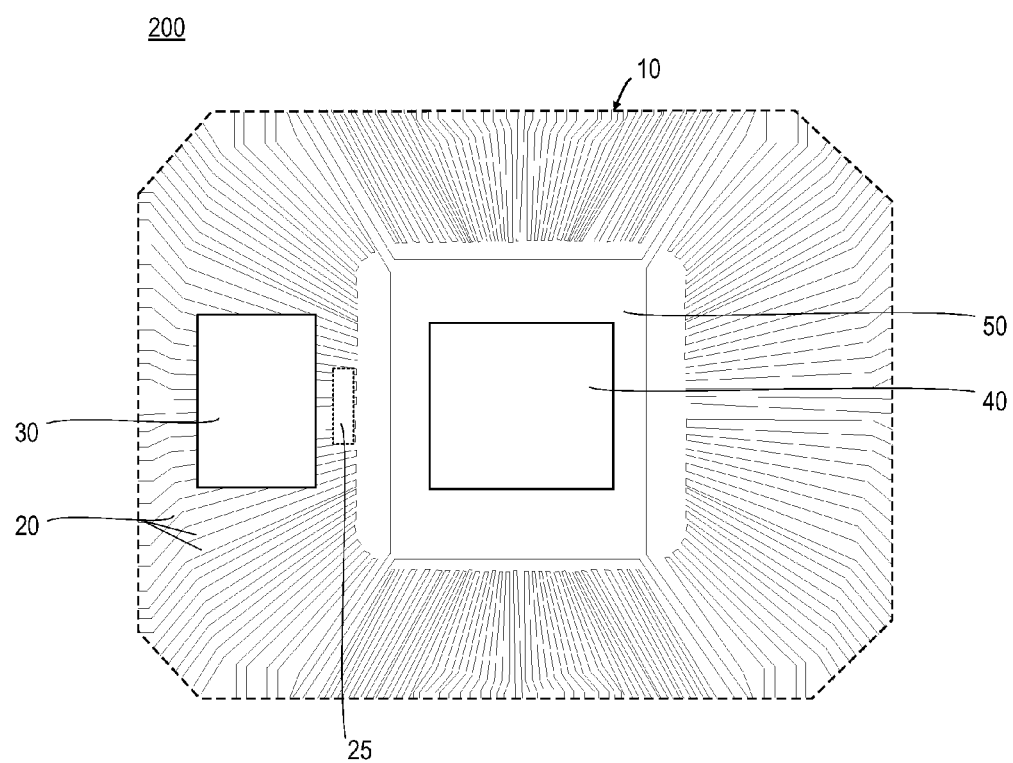
FIG. 2 is a cutaway top view of another microelectronic package, in accordance with various embodiments of the present invention.

According to various embodiments, two or more individual bonding fingers 20 of a leadframe 10 may be fused or otherwise coupled to each other as illustrated for the package 200 in FIG. 2. Similarly, one or more individual bonding fingers 20 may be fused to die paddle 50, as desired. Fusing or otherwise coupling at least the inner portions of bonding fingers 20 may advantageously provide enhanced mechanical strength for supporting chip 30 or 40. Moreover, fusing or otherwise coupling at least the inner portions of bonding fingers 20 may advantageously provide a more reliable voltage connection to chip 30 or 40. As used herein, "inner portion" may generally refer to the portion(s) of a bonding finger that is spatially located closest to the center of a leadframe (relative to the external leads, for example) and may encompass, in some embodiments, a substantial portion of a bonding finger.

As illustrated, some of bonding fingers 20 are fused together using a bonding material 25. In some of the embodiments, the coupled bonding fingers 20, once fused, would also have their pin input/output tied together. For example, if one of the coupled bonding fingers 20 is a power supply and is coupled to another one or more bonding finger(s) 20 using a conductive bonding material 25, the other bonding finger(s) 20 then may also be a power supply. In various embodiments, solder may be a suitable conductive bonding material 25. In various embodiments, however, a non-conductive bonding material 25 may be used so that such tying together is avoided, if desired, while decreasing movement of the coupled bonding fingers 20. Any one of various adhesives may be suitable for providing a non-conductive bonding material 25. For example, a material such as a die attach material or a polymeric compound such as, for example, epoxy, may be suitable.

In some embodiments, inner portions of one or more individual bonding fingers 20 of leadframe 10 may be fused together to form one or more unitary bonding fingers 20 during a manufacturing operation. Additionally or alternatively, one or more individual bonding fingers 20 may be fused to die paddle 50. For fusing operations, specialized leadframe tooling may be enlisted for fabricating leadframe 10.

In various embodiments, it may be desirable to temporarily secure bonding fingers 20 during only certain one or more packaging operations. For example, in some embodiments, bonding fingers 20 may be clamped or taped prior to mounting one or more of integrated circuits 30, 40. Such clamping or taping may be desirable to immobilize at least some of the bonding fingers 20 while mounting first integrated circuit chip 30 onto those bonding fingers 20. In various ones of the embodiments, subsequent to the mounting of first integrated circuit chip 30, bonding fingers 20 may be sufficiently stabilized as a result of the mounting such that further stabilization (such as fusing, as described previously), is unnecessary.

Such stabilization may be due to the adhesive material used for mounting first integrated circuit chip 30 providing an effect similar to that of fusing as previously described.

Figure 3:
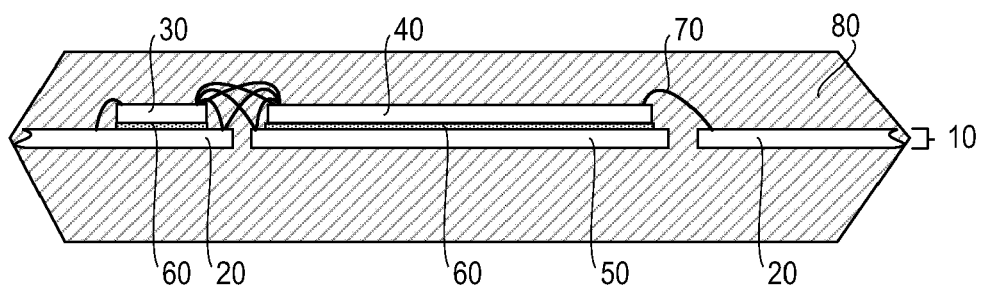
FIG. 3 is a cross-sectional view of the microelectronic package of FIG. 1, in accordance with various embodiments of the present invention.

Turning now to FIG. 3, illustrated is a cross-sectional view of the microelectronic package 100 of FIG. 1, with FIG. 3 depicting features that are excluded in FIG. 1 for the sake of clarity.

As illustrated, microelectronic package 100 comprises leadframe 10 including bonding fingers 20 and die paddle 50. In the illustrated embodiment, first and second integrated circuit chips 30, 40 are mounted onto bonding fingers 20 and die paddle 50, respectively, using an adhesive material 60. Adhesive material 60 may be any material suitable for purpose. In some embodiments, adhesive material 60 may comprise any non-flowing material such as, for example, a die-attach material. In various embodiments, adhesive material 60 used to mount first integrated circuit chip 30 to bonding fingers 20 may be the same or different adhesive material 60 used to mount second integrated circuit chip 40 to die paddle 50. For example, it may be desirable to use a non-conductive adhesive for mounting first integrated circuit chip 30 to bonding fingers 20 while using a conductive adhesive for mounting second integrated circuit chip 40 to die paddle 50, or vice versa.

As mentioned previously, bonding fingers 20 may form the pin-out of microelectronic package 100, for interconnecting microelectronic package 100 to one or more of signals, ground, and power, as in conventional packages. Within microelectronic package 100, first and second integrated circuit chips 30, 40 may be electrically interconnected with one or more of the other of first and second integrated circuit chips 30, 40, bonding fingers 20, and die paddle 50. As illustrated in FIG. 3, for example, first integrated circuit chip 30 is electrically interconnected via wires 70 to bonding fingers 20, die paddle 50, and second integrated circuit chip 40. Similarly, second integrated circuit chip 40 is electrically interconnected via wires 70 with die paddle 50, bonding fingers 20, and first integrated circuit chip 30. In various other embodiments, more or less of such interconnections may be made. For instance, in some embodiments, electrical interconnections may be made intra-die, that is, one location of an integrated circuit chip may be interconnected with another location of integrated circuit chip, depending on the application. Although not specifically illustrated, it will be understood by those skilled in the art that any one or more of the integrated circuit chips 30, 40, bonding fingers 20, and die paddle 50 may include bond pads for facilitating electrical interconnections as described.

According to various embodiments, microelectronic package 100 may include a molding material 80 for encapsulating various components included therein. As illustrated, molding material 80 encapsulates first and second integrated circuit chips 30, 40, wires 70, die paddle 50, and bonding fingers 20. Depending on the application, more or less molding material 80 may be used, or more or less of the components of microelectronic package 100 may be so encapsulated. For example, in some embodiments, the top portion including first and second integrated circuit chips 30, 40 may be encapsulated while the area under die paddle 50 and/or bonding fingers 20 may not be encapsulated. Such a configuration may be desirable, for example, for heat dissipation purposes and/or for electrical access to first and second integrated circuit chips 30, 40, as described more fully herein.

Figure 4:
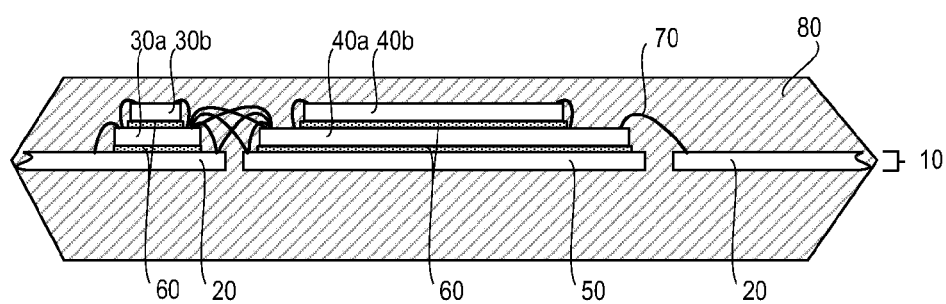
FIG. 4 is a cross-sectional view of another microelectronic package, in accordance with various embodiments of the present invention.

Microelectronic packages within the scope of this disclosure include those comprising stacked integrated circuit chips as alluded to previously. An example of such a configuration is illustrated in FIG. 4. In the illustrated embodiment, microelectronic package 400 comprises a leadframe 10 including bonding fingers 20 and a die paddle 50, encapsulated by molding material 80. Mounted on a surface formed by bonding fingers 20 are two integrated circuit chips 30a, 30b in a stacked configuration, mounted onto bonding fingers 20 and integrated circuit chip 30a, respectively, using an adhesive material 60. Also illustrated mounted on die paddle 50 are two integrated circuit chips 40a, 40b in a stacked configuration, mounted onto die paddle 50 and integrated circuit chip 40a, respectively, using an adhesive material 60.

Although the illustrated embodiment depicts two integrated circuit chips stacked on each of bonding fingers 20 and die paddle 50, more or less integrated circuit chips may be included in microelectronic package 400. For example, in various other embodiments, two or more integrated circuit chips may be stacked on bonding fingers 20 while one or none are stacked on die paddle 50, or vice versa.

Within microelectronic package 400, integrated circuit chips 30a, 30b may be electrically interconnected, via wires 70, with one or more of the other one of integrated circuit chips 30a, 30b, integrated circuit chip 40a, integrated circuit 40b, bonding fingers 20, and die paddle 50. As illustrated in FIG. 4, for example, integrated circuit chip 30b is electrically interconnected via wires 70 to integrated circuit chip 30a. Integrated circuit chip 30a is electrically interconnected via wires 70 to bonding fingers 20, die paddle 50, and integrated circuit chip 40a. Similarly, integrated circuit chip 40b is electrically interconnected via wires 70 to integrated circuit chip 40a. Integrated circuit chip 40a is electrically interconnected via wires 70 with die paddle 50, bonding fingers 20, and integrated circuit chip 30a. In various other embodiments, more or less of such interconnections may be made, and/or intra-die interconnections may be made, depending on the application.

Figure 6:
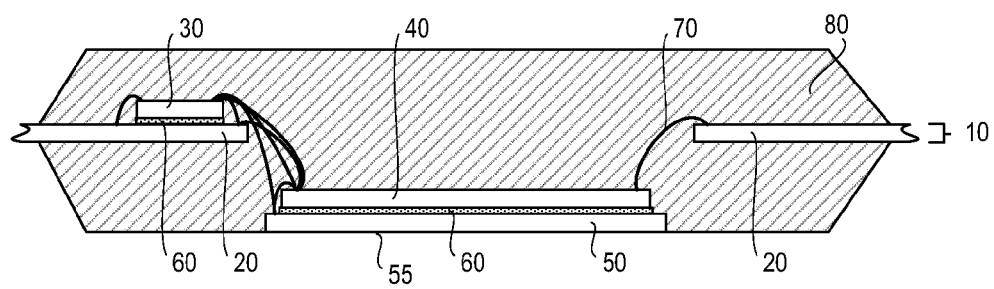
FIG. 6 is a cross-sectional view of another microelectronic package, in accordance with various embodiments of the present invention.
Figure 7:
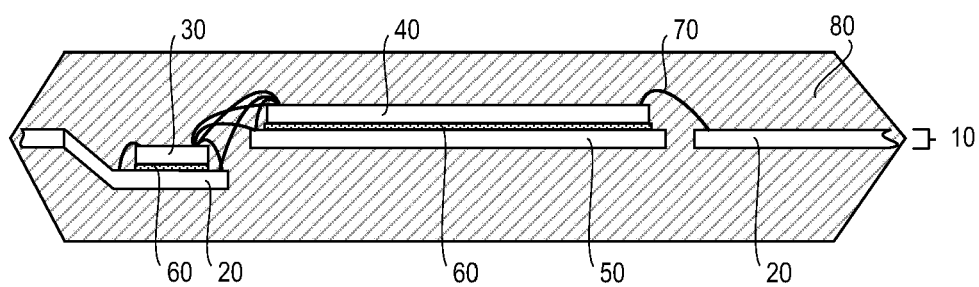
FIG. 7 is a cross-sectional view of another microelectronic package, in accordance with various embodiments of the present invention.

According to various embodiments, one or more portions of a leadframe may be down-set relative to other portions of the leadframe. "Down-set" as disclosed herein may refer to a vertical displacement relative to other portions of a leadframe, as will become more evident in the discussion to follow. Exemplary embodiments of down-set leadframes are illustrated in FIG. 5, FIG. 6, and FIG. 7.

Figure 5:
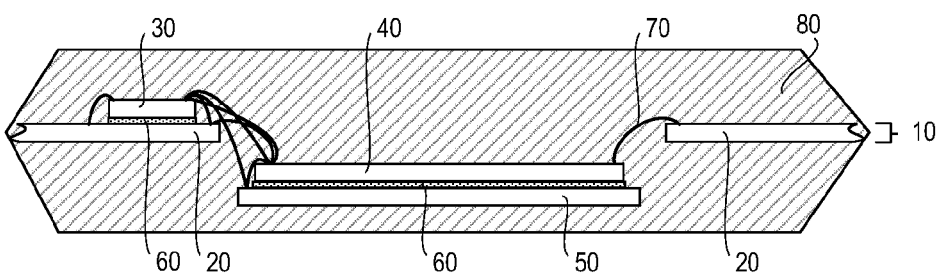
FIG. 5 is a cross-sectional view of another microelectronic package, in accordance with various embodiments of the present invention.

Referring now to FIG. 5, illustrated is a microelectronic package 500 comprising a leadframe 10 including bonding fingers 20 having a first integrated circuit chip 30 mounted on a portion thereof using an adhesive material 60, and a die paddle 50 having a second integrated circuit chip 40 mounted thereon using adhesive material 60. Electrical interconnections are made via wires 70, and various components of microelectronic package 500 are encapsulated using molding material 80. In this exemplary embodiment, die paddle 50 is down-set relative to bonding fingers 20. Such a configuration may be enlisted, for example, in embodiments wherein second integrated circuit chip 40 is relatively thick and/or wherein multiple integrated circuit chips are stacked on die paddle 50.

Although die paddle 50 of FIG. 5 is down-set, die paddle 50 is still within the molding material 80. In various other embodiments, die paddle 50 may be further down-set such as, for example, the embodiment of FIG. 6. FIG. 6 illustrates a microelectronic package 600 comprising a leadframe 10 including bonding fingers 20 and die paddle 50. Bonding fingers 20 include a first integrated circuit 30 mounted thereon using an adhesive material 60, and die paddle 50 includes a second integrated circuit chip 40 mounted thereon using adhesive material 60. Electrical interconnections are made via wires 70, and various components of microelectronic package are encapsulated using molding material 80. In the embodiment, die paddle 50 is down-set so that bottom surface 55 of die paddle 50 is exposed through molding material 80.

Although this exemplary configuration may be desirable in embodiments wherein second integrated circuit chip 40 is relatively thick and/or wherein multiple integrated circuit chips are stacked on die paddle 50, it may also be desirable for heat dissipation purposes. Exposure of bottom surface 55 of die paddle 50 may allow heat to dissipate from microelectronic package 500 by way of the exposed surface 55. In some cases, exposure of bottom surface 55 may allow for electrical access to die paddle 50, that is, for providing and/or receiving signals, power, or ground from microelectronic package 500.

Other portions of a leadframe may be down-set alternatively to or in addition to the die paddle such as, for example, the embodiment illustrated in FIG. 7. FIG. 7 illustrates a microelectronic package 700 comprising a leadframe 10 including bonding fingers 20 and die paddle 50. Bonding fingers 20 include a first integrated circuit 30 mounted thereon using adhesive material 60, and die paddle 50 includes a second integrated circuit chip 40 mounted thereon using adhesive material 60. Electrical interconnections may be made via wires 70, and various components of microelectronic package may be encapsulated using molding material 80. The portion of bonding fingers 20 having first integrated circuit 30 mounted thereon is down-set relative to other portions of bonding fingers 20 and to die paddle 50.

Similarly to the embodiments depicted in FIG. 5 and FIG. 6, the exemplary configuration illustrated in FIG. 7 may be desirable in embodiments wherein first integrated circuit chip 30 is relatively thick and/or wherein multiple integrated circuit chips are stacked on bonding fingers 20. In embodiments including one or more other integrated circuits mounted on other portion(s) of bonding fingers 20, the other portion(s) may be similarly down-set, depending on the application.

Any one or more features of various embodiments of the present invention may be incorporated into any leadframe-based package. Such leadframe-based packages may include, but are not limited to, quad flat packages, leadless quad flat packages, thin quad flat packages, quad flat no-lead packages, and thin small outline packages.

Furthermore, various embodiments of the present invention may be employed for all types of systems that use electronic packages including leadframes. For example, in exemplary embodiments, a leadframe in accordance with various embodiments may be used in portable electronic devices, such as, for example, mobile phones, laptop computers, personal digital assistants, gaming devices, music players, and video players. In various other exemplary embodiments, a leadframe may be used in stationary electronic devices, such as, for example, printers (e.g., digital printers), set-top boxes, desktop computing devices, and entertainment control units.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A microelectronic package comprising:
   a leadframe including i) a die paddle and ii) a plurality of bonding fingers;
   a first integrated circuit chip mounted onto one or more of the plurality of bonding fingers; and
   a second integrated circuit chip mounted onto the die paddle,
   wherein a first bonding finger of the plurality of bonding fingers is bonded, via bonding material, to a second bonding finger of the plurality of bonding fingers, and
   wherein at least a portion of the plurality of bonding fingers is down-set relative to other portions of the plurality of bonding fingers.

2. The microelectronic package of claim 1, wherein the first integrated circuit chip is mounted onto the down-set portions of the plurality of bonding fingers.

3. A microelectronic package comprising:
   a leadframe including i) a die paddle and ii) a plurality of bonding fingers;
   a first integrated circuit chip mounted onto one or more of the plurality of bonding fingers; and
   a second integrated circuit chip mounted onto the die paddle,
   wherein at least a portion of the plurality of bonding fingers is down-set relative to other portions of the plurality of bonding fingers.

4. The microelectronic package of claim 3, wherein the first integrated circuit chip is mounted onto the down-set portions of the plurality of bonding fingers.

5. The microelectronic package of claim 3, wherein the first integrated circuit chip is mounted onto the one or more bonding fingers using an adhesive.

6. The microelectronic package of claim 3, wherein multiple bonding fingers of the plurality of bonding fingers are bonded together via bonding material.

7. The microelectronic package of claim 6, wherein the first integrated circuit chip is mounted on the first bonding finger and the second bonding finger.

8. The microelectronic package of claim 3, wherein the die paddle is down-set relative to the plurality of bonding fingers.

9. The microelectronic package of claim 3, further comprising a third integrated circuit chip mounted onto one of the first integrated circuit chip and the second integrated circuit chip.

10. The microelectronic package of claim 3, wherein the first integrated circuit chip is electrically interconnected with the die paddle.

11. The microelectronic package of claim 3, wherein the second integrated circuit chip is electrically interconnected with the first integrated circuit chip.

12. The microelectronic package of claim 3, wherein the leadframe is selected from a group comprising a leadless quad flat-pack, a leadless small outline integrated circuit, a leadless thin small outline package (TSOP), a leaded SOIC, a leaded quad flat-pack, and a leaded TSOP.

13. The microelectronic package of claim 12, wherein the leadframe is a quad flat-pack.

* * * * *